United States Patent
Kwon et al.

(10) Patent No.: US 12,410,523 B1
(45) Date of Patent: Sep. 9, 2025

(54) INTEGRATED LOW K RECOVERY AND ALD METAL DEPOSITION PROCESS FOR ADVANCED TECHNOLOGY NODE

(71) Applicant: Applied Materials, Inc., Santa Clara, CA (US)

(72) Inventors: Shinjae Kwon, Santa Clara, CA (US); Xinyi Lu, Santa Clara, CA (US); Fredrick Kim, Santa Clara, CA (US); Bo Xie, San Jose, CA (US); Chi-I Lang, Cupertino, CA (US); Li-Qun Xia, Santa Clara, CA (US); Han Wang, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/774,617

(22) Filed: Jul. 16, 2024

Related U.S. Application Data

(60) Provisional application No. 63/571,672, filed on Mar. 29, 2024.

(51) Int. Cl.
| | |
|---|---|
| *C23C 16/48* | (2006.01) |
| *C23C 16/02* | (2006.01) |
| *C23C 16/34* | (2006.01) |
| *C23C 16/455* | (2006.01) |
| *H01L 21/02* | (2006.01) |

(52) U.S. Cl.
CPC ........ *C23C 16/482* (2013.01); *C23C 16/0227* (2013.01); *C23C 16/34* (2013.01); *C23C 16/45525* (2013.01); *H01L 21/0206* (2013.01); *H01L 21/02277* (2013.01)

(58) Field of Classification Search
None
See application file for complete search history.

(56) References Cited

U.S. PATENT DOCUMENTS

| | | | | |
|---|---|---|---|---|
| 2006/0254374 | A1* | 11/2006 | Baklanov | G01N 21/211 257/E21.531 |
| 2007/0077768 | A1* | 4/2007 | Fujii | H01L 21/76826 257/E21.255 |

(Continued)

FOREIGN PATENT DOCUMENTS

| WO | WO 2014/011364 | * | 1/2014 | ......... H01L 21/31 |
|---|---|---|---|---|

*Primary Examiner* — Sarah K Salerno
(74) *Attorney, Agent, or Firm* — Patterson + Sheridan, LLP

(57) ABSTRACT

In some embodiments, a method includes positioning a substrate within a processing chamber. The substrate includes a first low-k film having a first water contact angle. The first low-k film is disposed over an interconnect structure. The method further includes cleaning the substrate within the processing chamber to form a cleaned substrate. The cleaned substrate includes a damaged low-k film having a second water contact angle. The method further includes exposing the cleaned substrate to a recovery precursor to form a recovered substrate. The recovered substrate includes a recovered low-k film. The method further includes exposing the recovered substrate to a UV light source to form a treated substrate. The treated substrate includes a treated low-k film having a third water contact angle. The method further includes depositing a liner layer over the treated substrate via atomic layer deposition (ALD).

21 Claims, 9 Drawing Sheets

(56) References Cited

U.S. PATENT DOCUMENTS

2007/0249164 A1* 10/2007 Chen ................. H01L 21/76813
                                                         438/638
2009/0068768 A1*  3/2009 Urbanowicz .......... G01N 21/71
                                                       257/E21.53
2009/0179003 A1*  7/2009 Nishimura ........ H01L 21/76826
                                                         216/41
2016/0247695 A1*  8/2016 Niskanen .......... H01L 21/02334

* cited by examiner

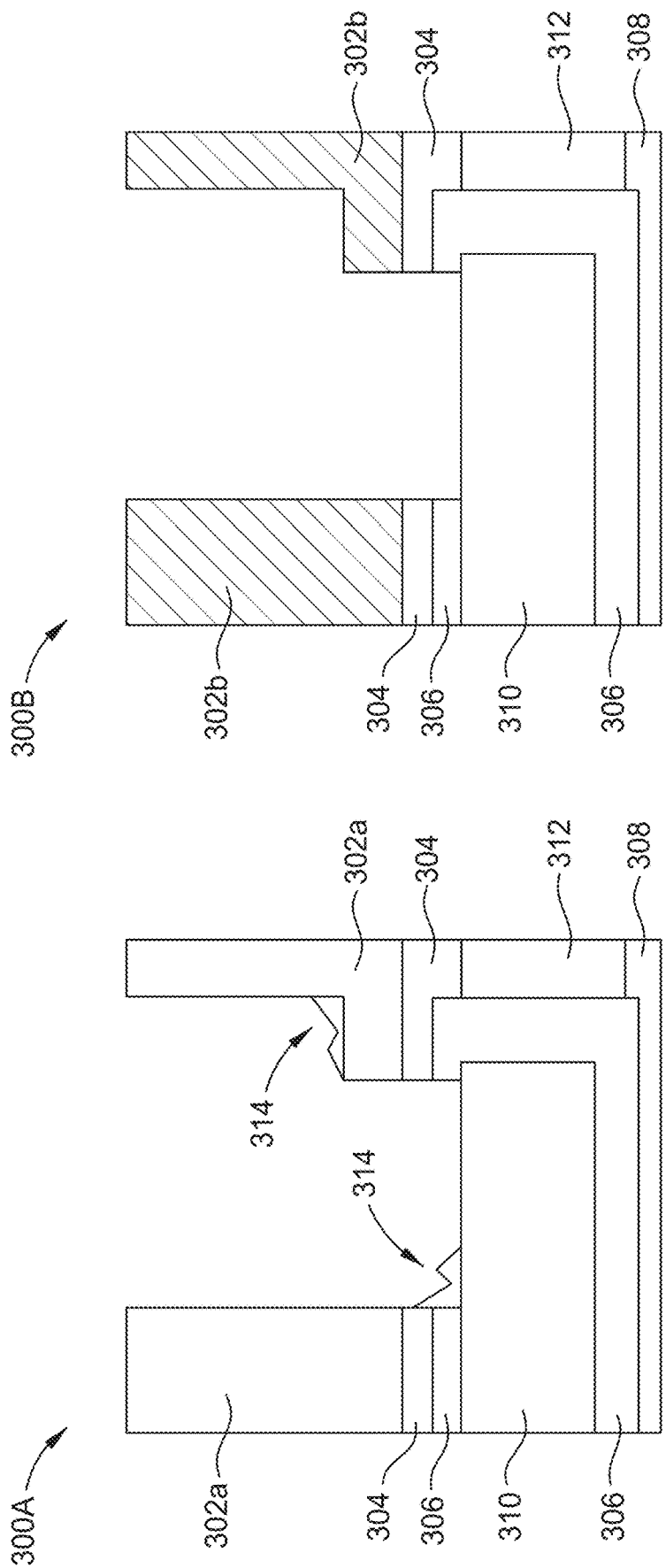

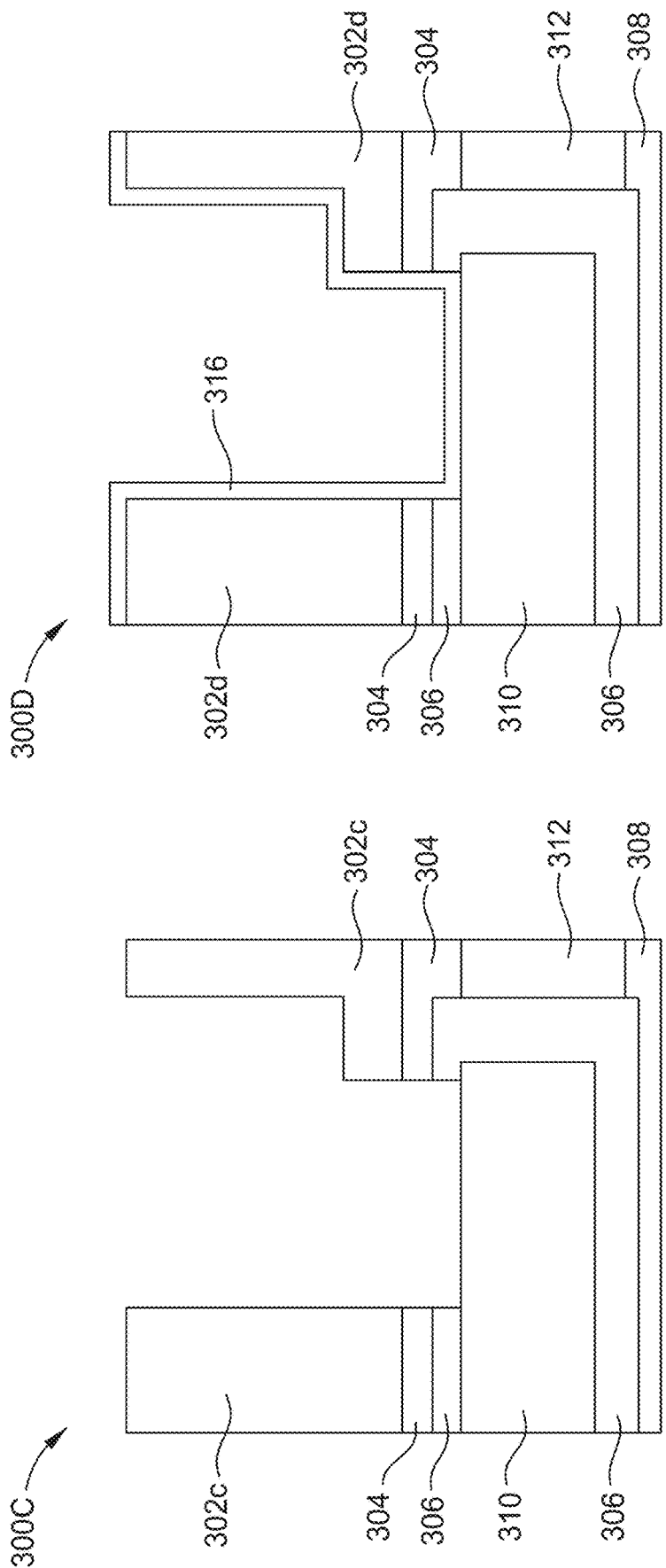

INTEGRATED LOW K RECOVERY AND ALD METAL DEPOSITION PROCESS FOR ADVANCED TECHNOLOGY NODE

FIELD

Embodiments described herein generally relate to processing low-k dielectric films. More specifically, embodiments described herein relate to processes for repairing low-k dielectric films and depositing metal layers thereon.

BACKGROUND

The dielectric constant (k) of dielectric films in semiconductor fabrication is continually decreasing as device scaling continues. Minimizing integration damage on low dielectric constant (low-k) films is beneficial to be able to continue decreasing feature sizes. Unfortunately, damage incurred to low-k films through various processes can cause increases in dielectric constant and surface hydrophilicity, both of which can result in decreased device performance (e.g., potential failure of an integrated circuit).

Efforts have been directed towards developing processes designed to recover properties lost due to accrued damage to the low-k film. However, the resulting properties of low-k films subjected to such processes may not allow subsequent processing and deposition operations. In many instances, low-k films having undergone a dielectric constant recovery process exhibit undesirable surface properties which are unfavorable for subsequent atomic layer deposition processes.

Thus, there is a need for improved processes for dielectric constant recovery.

SUMMARY

Embodiments described herein generally relate to processes for processing low-k dielectric films. More specifically, embodiments described herein relate to processes for repairing low-k dielectric films and depositing metal layers thereon.

In some embodiments, a method includes positioning a substrate within a processing chamber. The substrate includes a first low-k film having a first water contact angle. The first low-k film is disposed over an interconnect structure. The method further includes cleaning the substrate within the processing chamber to form a cleaned substrate. The cleaned substrate includes a damaged low-k film having a second water contact angle. The damaged low-k film is a product of the first low-k film. The method further includes exposing the cleaned substrate to a recovery precursor to form a recovered substrate. The recovered substrate includes a recovered low-k film. The recovered low-k film is a product of the damaged low-k film. The method further includes exposing the recovered substrate to a UV light source to form a treated substrate. The treated substrate includes a treated low-k film having a third water contact angle. The treated low-k film is a product of the recovered low-k film. The method further includes depositing a liner layer over the treated substrate via atomic layer deposition (ALD).

In some embodiments, a method includes positioning a substrate within a processing chamber. The substrate includes a first low-k film having a first water contact angle. The first low-k film is disposed over an interconnect structure. The method further includes cleaning the substrate within the processing chamber to form a cleaned substrate. The cleaned substrate includes a damaged low-k film having a second water contact angle. The damaged low-k film is a product of the first low-k film. The method further includes exposing the cleaned substrate to a UV light source to form a treated substrate. The treated substrate includes a treated low-k film having a third water contact angle. The treated low-k film is a product of the damaged low-k film. The method further includes exposing the treated substrate to a recovery precursor to form a recovered substrate. The recovered substrate includes a recovered low-k film. The recovered low-k film is a product of the treated low-k film. The method further includes depositing a liner layer over the recovered substrate via atomic layer deposition (ALD).

In some embodiments, a method includes positioning a substrate within a processing chamber. The substrate includes a first low-k film having a first water contact angle. The first low-k film is disposed over an interconnect structure. The method further includes cleaning the substrate within the processing chamber to form a cleaned substrate. The cleaned substrate includes a damaged low-k film having a second water contact angle. The damaged low-k film is a product of the first low-k film. The method further includes exposing the cleaned substrate to a recovery precursor to form a recovered substrate. The recovered substrate includes a recovered low-k film. The recovered low-k film is a product of the damaged low-k film. The method further includes exposing the recovered substrate to a UV light source to form a treated substrate. The treated substrate includes a treated low-k film having a third water contact angle. The treated low-k film is a product of the recovered low-k film. The method further includes depositing a liner layer over the treated substrate via atomic layer deposition (ALD). The first water contact angle is greater than the second water contact angle, and the second water contact angle is less than the third water contact angle.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

FIG. 3A is a partial schematic side cross-sectional views of an interconnect structure during a method, according to one or more embodiments.

FIG. 3B is a partial schematic side cross-sectional views of an interconnect structure during a method, according to one or more embodiments.

FIG. 3C is a partial schematic side cross-sectional views of an interconnect structure during a method, according to one or more embodiments.

FIG. 3D is a partial schematic side cross-sectional views of an interconnect structure during a method, according to one or more embodiments.

DETAILED DESCRIPTION

The present disclosure provides methods to recover properties of low-k films that were damaged during substrate processing procedures. Recovery processes disclosed herein generally include a series of sequential property recovery operations including exposing the substrate to one or more recovery precursors and exposing the substrate to a UV light source. Recovery processes disclosed herein can reduce elevated k values of damaged low-k films, and also increase surface hydrophobicity of such films. Additionally, the sequential recovery processes of the present disclosure provide a balance between the recovery of low-k values and recovery of hydrophilic/hydrophobic properties such that the surface of the resulting films are favorable for subsequent ALD metal film deposition.

Figure 1:
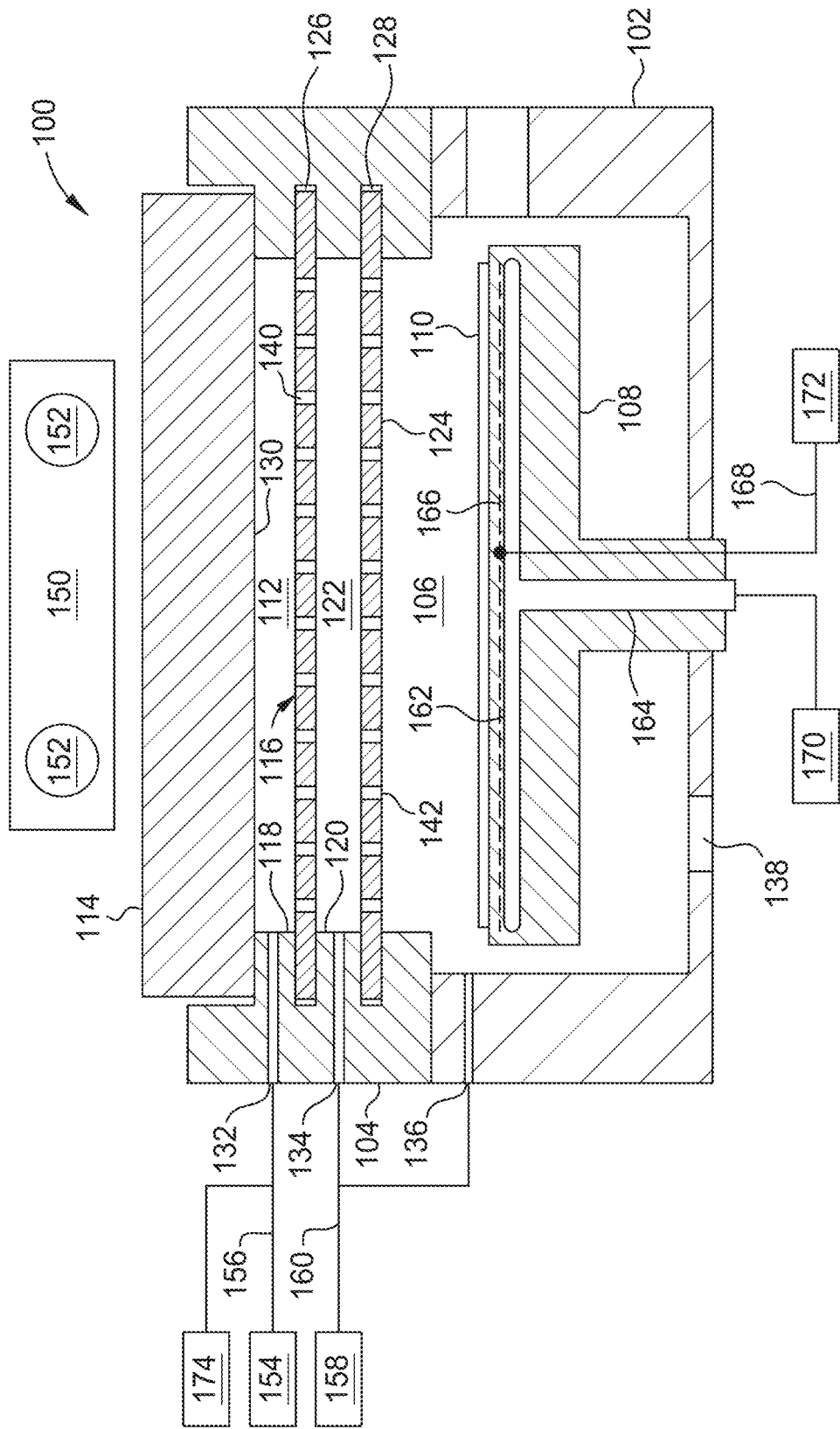
FIG. 1 is a schematic cross-sectional view of a process chamber, according to one or more embodiments.

FIG. 1 is a schematic cross-sectional view of a process chamber 100, according to one or more embodiments. The process chamber 100 may be a vapor deposition chamber that includes UV radiation for assisting a silylation reaction. In one or more embodiments, the process chamber 100 may be the ONYX® or the SILENA® process chamber available from Applied Materials, Inc., of Santa Clara, California. The process chamber 100 includes a chamber body 102 and a chamber lid 104 disposed over the chamber body 102. The chamber body 102 and the chamber lid 104 form an inner volume 106. A substrate support assembly 108 is disposed in the inner volume 106. The substrate support assembly 108 may receive and support a substrate 110 thereon for processing.

A first UV transparent gas distribution showerhead 116 may be hung in the inner volume 106 through a central opening 112 of the chamber lid 104 by an upper clamping member 118 and a lower clamping member 120. The UV transparent gas distribution showerhead 116 may be positioned facing the substrate support assembly 108 to distribute one or more processing gases across a distribution volume 122, which is below the first UV transparent gas distribution showerhead 116. A second UV transparent gas showerhead 124 may be hung in the inner volume 106 through the central opening 112 of the chamber lid 104 below the first UV transparent gas distribution showerhead 116. Each of the UV transparent gas distribution showerheads 116, 124 may be disposed in a recess formed in the chamber lid 104. A first recess 126 may be an annular recess around an internal surface of the chamber lid 104, and the first UV transparent gas distribution showerhead 116 fits into the first recess 126. Likewise, a second recess 128 may receive the second UV transparent gas distribution showerhead 124.

A UV transparent window 114 may be disposed above the first UV transparent gas distribution showerhead 116. The UV transparent window 114 may be positioned above the first UV transparent gas distribution showerhead 116 forming a gas volume 130 between the UV transparent window 114 and the first UV transparent gas distribution showerhead 116. The UV transparent window 114 may be secured to the chamber lid 104 by any means, such as clamps, screws, bolts, etc.

The UV transparent window 114 and the first and second UV transparent gas distribution showerheads 116, 124 may be at least partially transparent to thermal or radiant energy within the UV wavelengths. The UV transparent window 114 may be quartz or another UV transparent material, such as sapphire, $CaF_2$, $MgF_2$, AlON, a silicon oxide material, a silicon oxynitride material, or another transparent material.

A UV source 150 may be disposed above the UV transparent window 114. The UV source 150 may be configured to generate UV energy and project the UV energy towards the substrate support assembly 108 through the UV transparent window 114, the first UV transparent gas distribution showerhead 116, and the second UV transparent gas distribution showerhead 124, thereby exposing the substrate 110 on the substrate support assembly 108 to UV light. A cover (not shown) may be disposed above the UV source 150. In one or more embodiments, the cover may be shaped to assist the projection of the UV energy from the UV source 150 towards the substrate support.

In one or more embodiments, the UV source 150 may include one or more UV lights 152 to generate UV radiation. The UV lights 152 may be lamps, LED emitters, or other UV emitters. In one or more embodiments, the UV lights 152 may be argon lamps discharging radiation at 126 nm, krypton lamps discharging at 146 nm, xenon lamps discharging at 172 nm, krypton chloride lamps discharging at 222 nm, xenon chloride lamps discharging at 308 nm, mercury lamps discharging at 254 nm or 365 nm, metal vapor lamps such as zinc discharging at 214 nm, rare earth near-UV lamps such as europium-doped strontium borate or fluoroborate lamps discharging at 368-371 nm, to name a few examples.

The process chamber 100 may include flow channels 132, 134, 136 configured to supply one or more processing gases across the substrate support assembly 108 to process a substrate 110 disposed thereon. A first flow channel 132 provides a flow pathway for gas to enter the gas volume 130 and to be exposed to UV radiation from the UV source 150. The gas from the gas volume 130 may flow through the first UV transparent gas distribution showerhead 116 into the distribution volume 122. A second flow channel 134 may provide a flow pathway for precursor compounds and gases to enter the distribution volume 122 directly without passing through the first UV transparent gas distribution showerhead 116 to mix with the gas that was previously exposed to UV radiation in the gas volume 130. The mixed gases in the distribution volume 122 may be further exposed to UV radiation through the first UV transparent gas distribution showerhead 116 before flowing through the second UV transparent gas distribution showerhead 124 into a space proximate the substrate support assembly 108. The gas proximate the substrate support assembly 108, and a substrate disposed on the substrate support assembly 108, is further exposed to the UV radiation through the second UV transparent gas distribution showerhead 124. Purge gases may be provided through an opening 138 in the bottom of the process chamber 100 such that the purge gas flow around the substrate support assembly 108, preventing intrusion of processing gases into the space under the substrate support assembly 108. One or more gases may be exhausted through the opening 138.

The first UV transparent gas distribution showerhead 116 may include a plurality of holes 140 that allow processing gas to flow from the gas volume 130 to the distribution volume 122. The second UV transparent gas distribution showerhead 124 may also include a plurality of holes 142 that allow processing gas to flow from the distribution volume 122 into the processing space proximate the substrate support assembly 108. The holes 140, 142 in the first and second UV transparent gas distribution showerheads 116, 124 may be evenly distributed or irregularly spaced.

A purge gas or carrier gas source 154 may be coupled to the first flow channel 132 through a conduit 156. Purge gas from the purge gas source 154 may be provided through the first flow channel 132 during substrate processing to prevent intrusion of process gases into the gas volume 130. A cleaning gas source 174 may also be coupled to the first flow channel 132 through the conduit 156 to provide cleaning of the conduit 156, the first flow channel 132, the gas volume 130, and the rest of the chamber body 102 when not processing substrates.

A process gas or precursor compound source 158 may be coupled to the second flow channel 134 through a conduit 160 to provide a mixture, as described above, to the chamber body 102. The process gas source 158 may also be coupled to a third flow channel 136. Appropriate valves may allow selection of one or both of the flow channels 134, 136 for flowing the process gas mixture into the chamber body 102.

Substrate temperature may be controlled by providing heating and cooling features in the substrate support assembly 108. A coolant conduit 164 may be coupled to a coolant source 170 to provide a coolant to a cooling plenum 162 disposed in the substrate support assembly 108. One example of a coolant that may be used is a mixture of 50% ethylene glycol in water, by volume. The coolant flow is controlled to maintain temperature of the substrate at or below a desired level to promote deposition of UV-activated oligomers or fragments on the substrate. A heating element 166 may also be provided in the substrate support assembly 108. The heating element 166 may be a resistive heater, and may be coupled to a heating source 172, such as a power supply, by a conduit 168. The heating element 166 may be used to heat the substrate during the hardening process described above.

Figure 2:
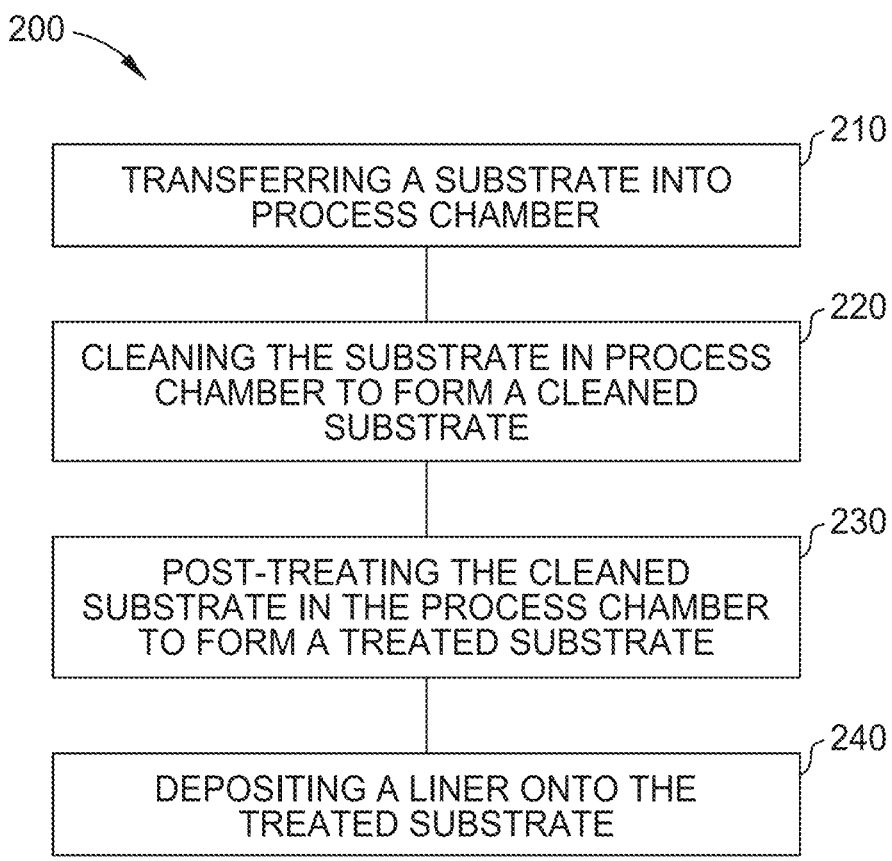
FIG. 2 is a schematic block diagram of a method of substrate processing, according to one or more embodiments.
Figure 4B:
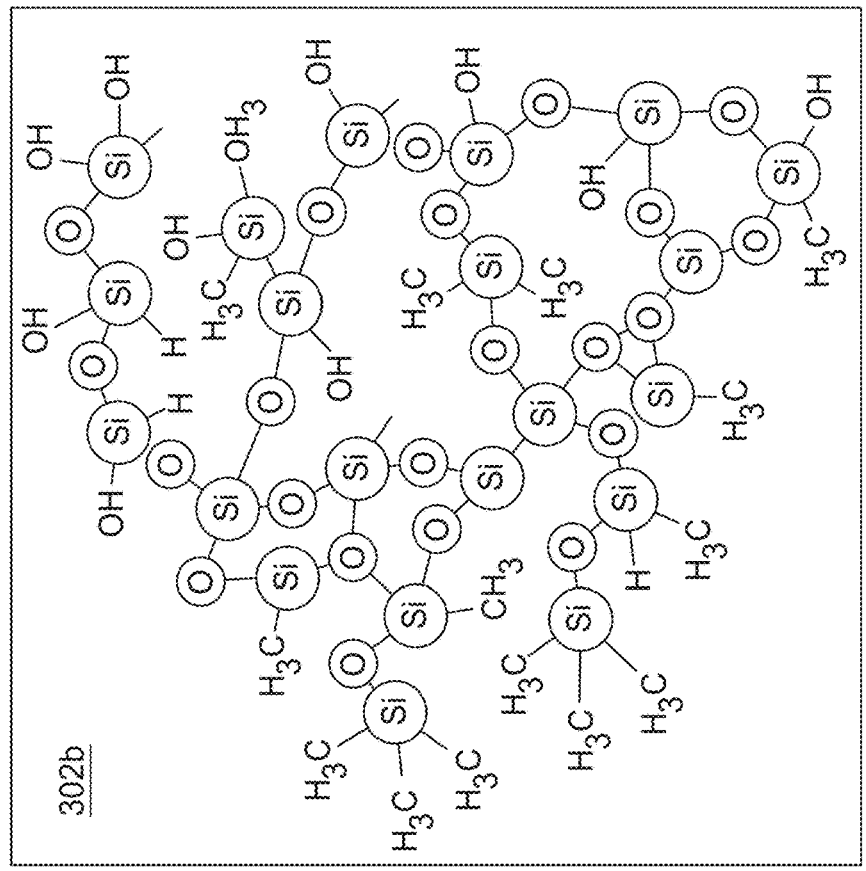
FIG. 4B is a molecular representation of a low-k film during a method, according to one or more embodiments.
Figure 4A:
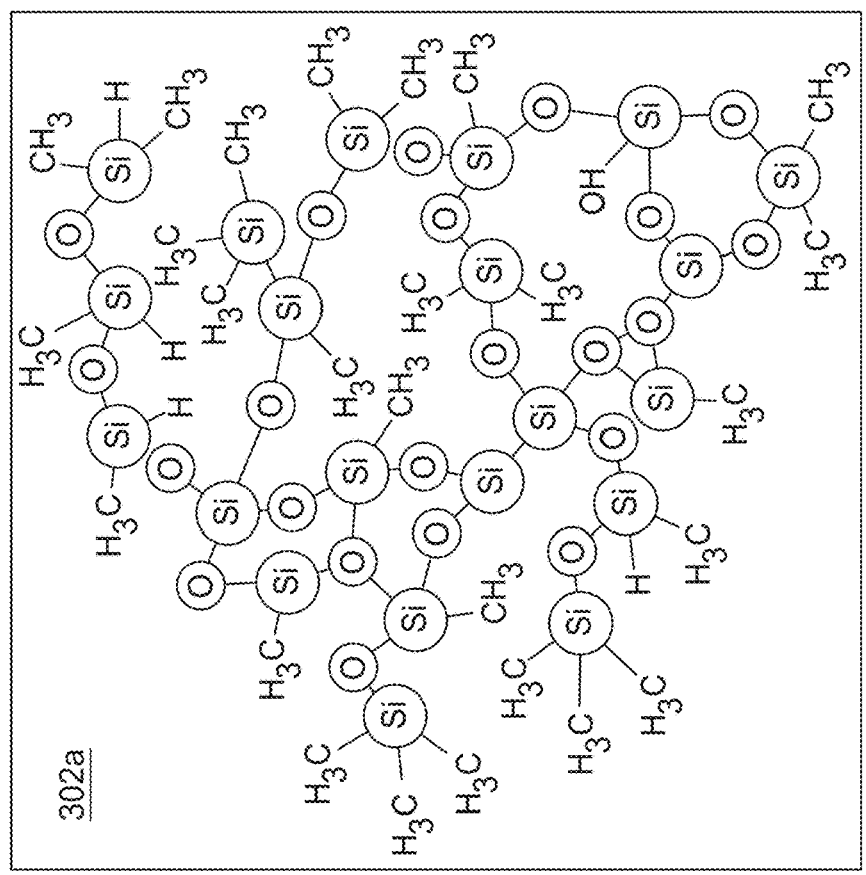
FIG. 4A is a molecular representation of a low-k film during a method, according to one or more embodiments.
Figure 4C:
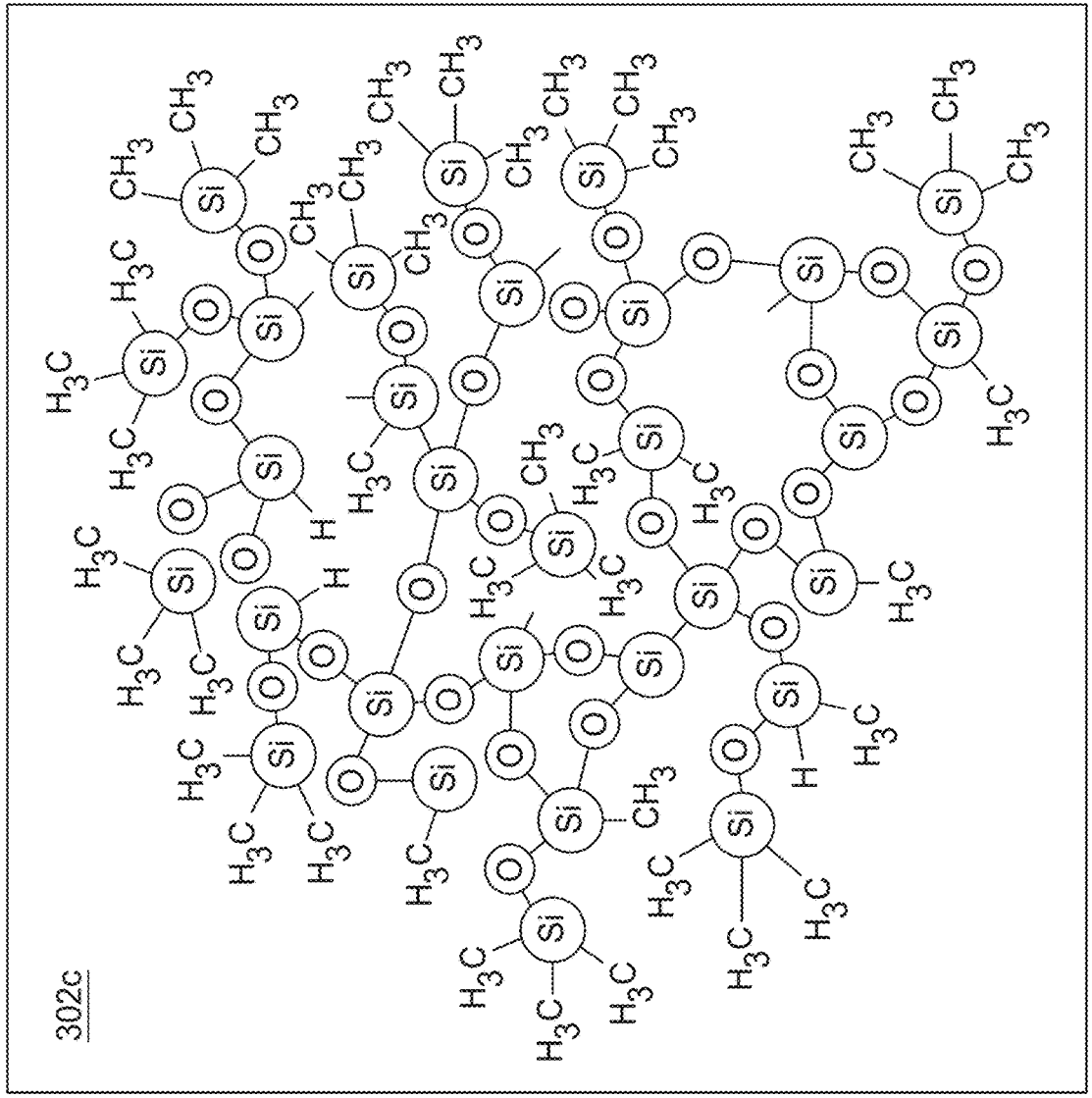
FIG. 4C is a molecular representation of a low-k film during a method, according to one or more embodiments.

FIG. 2 is a schematic block diagram of a method 200 of substrate processing, according to one or more embodiments. FIGS. 3A-3D are partial schematic side cross-sectional views of an interconnect structure 300A-300D during the method 200, according to one or more embodiments. FIGS. 4A-4C are molecular views of a low-k film 302a, 302b, and 302c during the method 200, according to one or more embodiments.

At operation 210, a substrate, which may include an interconnect structure 300A shown in FIG. 3A, is transferred into a process chamber. The process chamber may be a deposition process chamber such as the process chamber 100 depicted in FIG. 1. At operation 210, the interconnect structure 300A is a post-deposition interconnect structure. In other words, the interconnect structure 300A includes a low-k film deposited thereon prior to operation 210. The interconnect structure 300A, shown in FIG. 3A may include a low-k film 302a on an etch stop layer 304, a metal barrier 306 between the etch stop layer 304 and a copper layer 310, a metal barrier 306 between the copper layer 310 and a substrate 308, residue 314 on the copper layer 310, and residue 314 on the low-k film 302a. The interconnect structure 300A may also include an intermediate layer 312 between the substrate 308 and the etch stop layer 304. In some embodiments, an interconnect structure with a different configuration than that shown in FIG. 3A may be utilized in method 200.

FIG. 4A is a molecular view of the low-k film 302a at operation 210. In FIG. 4A, the low-k film 302a has Si—O bonds, Si—CH$_3$ bonds, and Si—H bonds. In some embodiments, the metal barrier 306 may comprise tantalum nitride (TaN), hafnium oxide (HfO$_2$), aluminum oxide (AlO$_x$), zirconium oxide (ZrO$_2$), titanium nitride (TiN), nickel oxide (NiO), nickel nitride (NiN), and combinations thereof.

At operation 220, the interconnect structure 300A is cleaned in the process chamber, such as process chamber 100. As a result of operation 220, the low-k film 302a of the interconnect structure 300A can become damaged. As shown in FIGS. 4A and 4B, the overall number of Si—CH$_3$ bonds initially present in the low-k film 302a may be decreased and Si—OH bonds may be formed, resulting in the low-k film 302b. With the increase of Si—OH bonds, the low-k film 302b becomes more hydrophilic relative to the low-k film 302a, which is undesirable. The decrease in Si—CH$_3$ bonds in the low-k film 302b results in an increased k value of the low-k film 302b, relative to the initial k value of the low-k film 302a. In some embodiments, the cleaning operations of operation 220 may include etching, ash, wet cleaning operations, or combinations thereof.

In at least one embodiment, the cleaning operations of operation 220 can include a plasma etch treatment process. In one exemplary embodiment, a process pressure in the processing chamber 100 is regulated between about 10 mTorr to about 5000 mTorr, such as about 10 mTorr and about 400 mTorr, such as about 200 mTorr. A RF bias power at a frequency of about 13 MHZ may be applied to maintain a plasma in the treatment gas mixture (e.g., a hydrogen containing gas, such as diatomic hydrogen). For example, a RF bias power of less than 100 Watts, such as about 5 Watts to about 50 Watts may be applied to maintain a plasma inside the processing chamber 100. The treatment gas mixture may be flowed into the chamber at a rate of about 100 sccm to about 800 sccm. The interconnect structure 300A is maintained at a temperature of about 25° C. to about 300° C., such as about 50° C. to about 140° C., such as about 50° C. to about 130° C., such as about 110° C. to about 125° C. The interconnect structure 300A may be subjected to the cleaning operations of operation 220 for about 5 second to about 300 second, such as about 30 seconds to about 90 seconds.

At operation 230, the interconnect structure 300B is subjected to a post-treatment process, where the low-k film 302b of the interconnect structure 300B is repaired. As such, the k value of the low-k film 302c of the interconnect structure 300C decreases in comparison to the k value of the low-k film 302b. Furthermore, the hydrophobicity of the low-k film 302c increases relative to the hydrophobicity of the low-k film 302b, as a result of the repaired chemical structure of the low-k film 302c. Operation 230 may be performed in the same chamber as operation 220, or may be performed in a different chamber. As shown in FIG. 4C, the low-k film 302c has fewer to no Si—OH bonds and a greater percentage of Si—CH$_3$ bonds than low-k films 302a and/or 302b shown in FIG. 3A and FIG. 3B, respectively. In conventional repair processes, low-k films which have undergone a dielectric constant recovery process exhibit hydrophobic surface properties which are unfavorable for subsequent atomic layer deposition processes. However, aspects of this disclosure result in more favorable (e.g., less hydrophobic) surface properties.

In some embodiments, operation 230 may include exposing the low-k film 302b of the interconnect structure 300B to a recovery precursor, an ultraviolet (UV) light source, or a combination thereof. In some embodiments, operation 230 includes the removal of the Si—OH bonds of the low-k film 302b and the formation of the Si—O—Si bonds of the low-k film 302c. Without being bound by theory, such chemical reactions may be performed via reaction schemes (1) and (2) shown below. Chemical reactions of schemes (1) and (2) illustrate the removal of the Si—OH bonds and the formation of the Si—CH$_3$ bonds when the low-k film 302b is exposed to a recovery precursor.

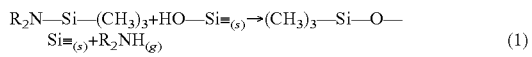

$$R_2N—Si—(CH_3)_3+HO—Si\equiv_{(s)} \to (CH_3)_3—Si—O—Si\equiv_{(s)}+R_2NH_{(g)} \quad (1)$$

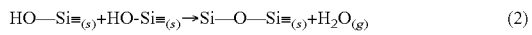

$$HO—Si\equiv_{(s)}+HO-Si\equiv_{(s)} \to Si—O—Si\equiv_{(s)}+H_2O_{(g)} \quad (2)$$

In some embodiments, operation 230 may also be performed utilizing UV light, for example, the interconnect structure 300B may be exposed to UV light during operation 230.

At operation 240, and as shown in FIGS. 3C and 3D, the interconnect structure 300C is subjected to a liner deposition process where a liner layer 316 is disposed over the surface of the interconnect structure 300C including, at least, the low-k film 302c and/or the surface of the copper layer 310 to form the interconnect structure 300D. The liner layer 316 of the interconnect structure 300D may be deposited by any suitable deposition method, such as atomic layer deposition (ALD), chemical vapor deposition (CVD), high pressure CVD (HPCVD), high density plasma CVD, remote plasma CVD, microwave assisted CVD, NBECVD or plasma enhanced atomic layer deposition (PEALD) where the terms ALD, CVD, HPCVD, NBECVD, PEALD refer to the sequential introduction of reactants or precursors to deposit a layer over a substrate structure, or any other suitable deposition process. In at least one embodiment, the liner layer 316 of the interconnect structure 300D is a metal liner deposited by an ALD process, such as TaN and/or HfO$_2$.

In some embodiments, operation 240 includes depositing a liner layer 316 over the interconnect structure 300C via an ALD process. The ALD process may be conducted in a process chamber, such as the process chamber 100 depicted in FIG. 1. In at least one embodiment, the ALD process includes exposing the interconnect structure 300C to a metal precursor and a reactant (e.g., an alcohol and/or ammonia gas) to form a metal layer thereon. The metal precursor may include one or more of aluminum, hafnium, zirconium, nickel, zinc, tantalum, or titanium. The metal precursor may also include a carbo ligand, an amino ligand, a halide ligand, or a combination thereof.

The temperature of the interconnect structure 300C during the ALD process can be any suitable temperature depending on, for example, the precursor(s) being used. During processing, the interconnect structure 300C can be heated or cooled. Such heating or cooling can be accomplished by any suitable means. In some embodiments, the interconnect structure 300C is maintained at a temperature greater than or equal to about 25° C., or about 50° C., or about 100° C., or about 150° C., or about 200° C., or about 250° C., or about 300° C., or about 350° C., or about 400° C., or about 450° C., or about 500° C. In some embodiments, the interconnect structure 300C temperature is maintained at a temperature less than or equal to about 600° C., or about 550° C., or about 500° C., or about 450° C., or about 400° C., or about 350° C., or about 300° C., or about 250° C., or about 200° C., or about 150° C., or about 100° C., or about 50° C., or about 25° C. In some embodiments, the interconnect structure 300C temperature is maintained at a temperature of about 350° C.

The metal precursor and reactant may be provided to the processing chamber. The flow rate of the metal precursor and reactant can be any suitable flow rate such as about 1 sccm to about 5000 sccm, such as about 200 sccm to about 4000 sccm, such as about 300 sccm to about 3000 sccm, such as about 5000 sccm to about 2000 sccm. The metal precursor and reactant can be provided at any suitable pressure such as about 5 mTorr to about 25 Torr, such as about 100 mTorr to about 20 Torr, such as about 5 Torr to about 20 Torr, such as about 50 mTorr to about 2000 mTorr, such as about 100 mTorr to about 1000 mTorr, such as about 200 mTorr to about 500 mTorr.

The period of time that the interconnect structure 300C is exposed to metal precursor and reactant may be any suitable amount of time necessary to allow for an adequate nucleation layer to form over the surface of the interconnect structure 300C. The interconnect structure 300C may be exposed to the metal precursor and reactant for about 0.1 seconds to about 90 seconds, such as about 0.5 seconds to about 60 seconds, such as about 1 second to about 30 seconds, such as about 2 seconds to about 25 seconds, such as about 3 seconds to about 20 seconds, such as about 4 seconds to about 15 seconds, such as about 5 seconds to about 10 seconds.

In some embodiments, an inert gas may additionally be provided to the process chamber at the same time as the metal precursor and reactant. The inert gas may be flowed into the processing chamber at a constant flow rate of about 1 sccm to about 10000 sccm. The inert gas may be any inert gas, such as argon, helium, neon, combinations thereof, or the like.

In some embodiments, the process chamber is maintained at a pressure of about 0.2 Torr to about 100 Torr throughout the ALD process, such as about 0.3 Torr to about 90 Torr, such as about 0.5 Torr to about 80 Torr, such as about 1 Torr to about 50 Torr. The processing chamber pressure during deposition can be about 50 mTorr to 750 Torr, such as about 100 mTorr to about 400 Torr, such as about 1 Torr to about 100 Torr, such as about 2 Torr to about 10 Torr.

In some embodiments, the resulting liner layer 316 of the interconnect structure 300D has a thickness of about 1200 Å to about 1300 Å, such as about 1225 Å to about 1275 Å, such as about 1240 Å to about 1260 Å, alternatively about 1200 Å to about 1225 Å, alternatively about 1225 Å to about 1240 Å, alternatively about 1260 Å to about 1275 Å, alternatively about 1275 Å to about 1300 Å.

Figure 5:
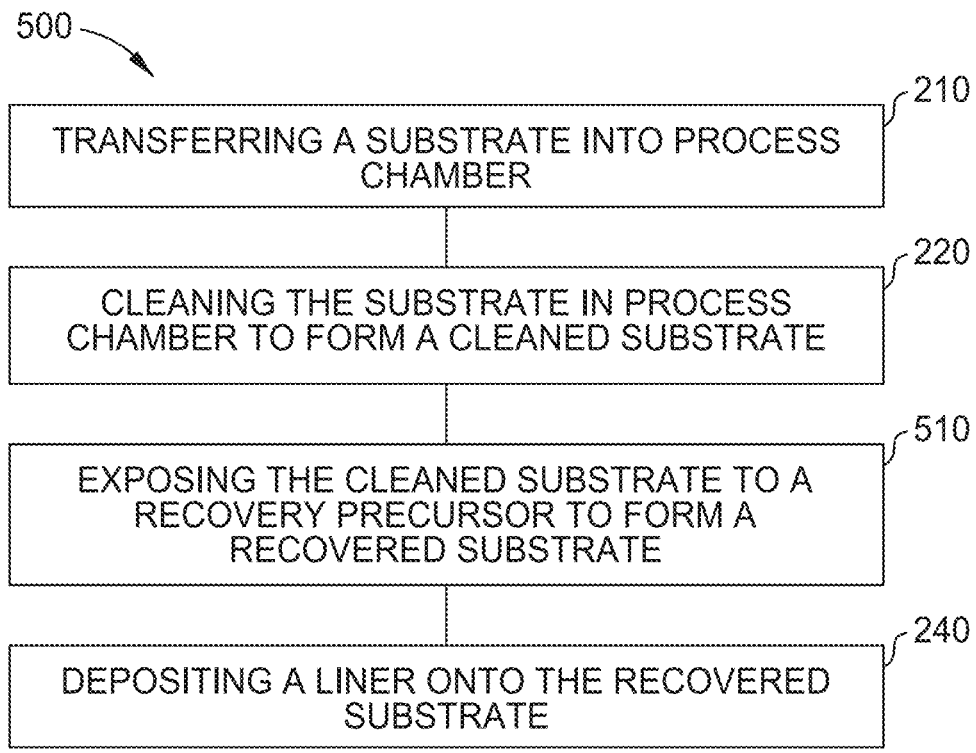
FIG. 5 is a schematic block diagram of a method of substrate processing, according to one or more embodiments.

FIG. 5 is a schematic block diagram of a method 500 of substrate processing, according to one or more embodiments. Similar to the method 200, at operation 210, a substrate, such as a wafer having an interconnect structure 300A shown in FIG. 3A, is transferred into a process chamber. The process chamber may be a deposition process chamber such as the process chamber 100 depicted in FIG. 1. At operation 210, the interconnect structure 300A is a post-deposition interconnect structure. In other words, the interconnect structure 300A includes a low-k film deposited thereon prior to operation 210. At operation 220, the interconnect structure 300A is cleaned in the process chamber 100. As previously discussed, the cleaning operations of operation 220 can damage the chemical composition of the low-k film 302a of interconnect structure 300A, resulting in the increased hydrophilicity and increased k values of the low-k film 302b of the interconnect structure 300B.

At operation 510, the interconnect structure 300B is subjected to a post-treatment process, where the low-k film 302b of the interconnect structure 300B is repaired via exposure to a recovery precursor resulting in the low-k film 302c of the interconnect structure 300C. A recovery precursor can be an aminosilane. For example, the recovery precursor may include a molecule selected from Group 1. In Group 1, each R may be independently selected from methyl, ethyl, isopropyl, tert-butyl, and H. Each R' may be independently selected from an alkane, an alkene, and an alkyne. Each R' may independently include one to twenty carbon atoms, such as 2 to 10 carbon atoms, such as 3 to 5 carbon atoms.

Group 1

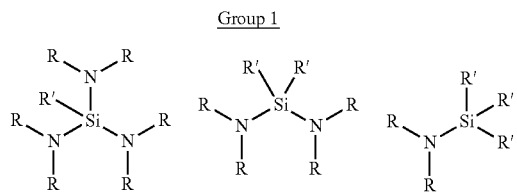

In one or more embodiments, the recovery precursor may be one or more of the molecules pictured in Group 1 Examples below.

Group 1

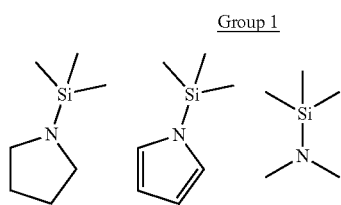

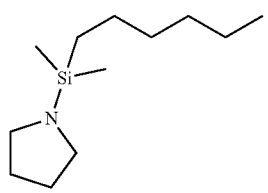

EXAMPLES

In some embodiments, the recovery precursor may include an oxysilane, such as an oxysilane selected from Group 2. In Group 2, each R may be independently selected from methyl, ethyl, isopropyl, and tert-butyl. Each R' may be independently selected from an alkyl, a cycloalkyl, an alkynyl, and an aryl. Each R' may independently include one to twenty carbon atoms, such as 2 to 10 carbon atoms, such as 3 to 5 carbon atoms.

Group 2

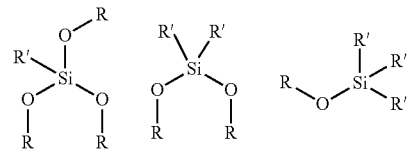

In certain embodiments, the recovery precursor may include a halosilane, such as a halosilane selected from Group 3. In Group 3, each X may be independently Cl, Br, or I. Each R' may be independently selected from alkyl, a cycloalkyl, an alkynyl, and an aryl. Each R' may independently include one to twenty carbon atoms, such as 2 to 10 carbon atoms, such as 3 to 5 carbon atoms.

Group 3

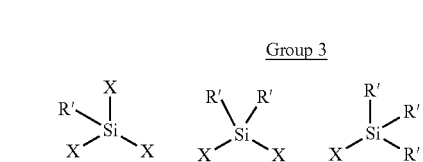

In certain embodiments, the recovery precursor may include an acetylsilane, such as an acetylsilane of Group 4. In Group 4, each R' may be independently selected from an alkyl, a cycloalkyl, an alkynyl, and an aryl. Each R may be an alkyl. Each R' may include one to twenty carbon atoms, such as 2 to 10 carbon atoms, such as 3 to 5 carbon atoms.

Group 4

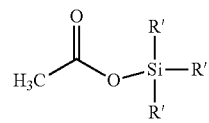

In certain embodiments, the recovery precursor may include an ester, such as an ester selected from Group 5. In Group 5, each R and R' may be independently selected from hydrogen, alkyl, a cycloalkyl, an alkynyl, and an aryl. In embodiments where R and/or R' contain carbon atoms, each R and R' may independently include one to twenty carbon atoms, such as 2 to 10 carbon atoms, such as 3 to 5 carbon atoms.

Group 5

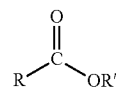

In certain embodiments, the recovery precursor may include a molecule selected from Group 6. In Group 6, each R, R', and R" may be independently selected from hydrogen, an alkane, an alkene, an alkyne, and an aryl. In embodiments where R, R', and/or R" contain carbon, R, R', and R" may include one to twenty carbon atoms, such as 2 to 10 carbon atoms, such as 3 to 5 carbon atoms.

Group 6

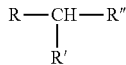

In some embodiments, operation 510 may be performed in a processing chamber, such as the process chamber 100 depicted in FIG. 1. In some embodiments, the recovery precursor may be introduced to the processing chamber using a precursor gas flow rate of about 100 milligrams per minute (mgm) to about 2000 mgm, such as about 250 mgm to about 1500 mgm, such as about 500 mgm to about 1000 mgm, alternatively about 100 mgm to about 250 mgm, alternatively about 250 mgm to about 500 mgm, alternatively about 1000 mgm to about 1500 mgm, alternatively about 1500 mgm to about 2000 mgm. In some embodiments, the recovery precursor may be introduced into the processing chamber with a carrier gas, such as He, Ar, $N_2$, and combinations thereof. The carrier gas may be introduced into the processing chamber using a gas flow rate of about 1000 standard cubic centimeters per minute (sccm) to about 5000 sccm, such as about 2000 sccm to about 4000 sccm, such as about 2500 sccm to about 3500 sccm, alternatively about 1000 sccm to about 2000 sccm, alternatively about 2000 sccm to about 2500 sccm, alternatively about 3500 sccm to about 4000 sccm, alternatively about 4000 to about 5000 sccm.

In one or more embodiments, the pressure within the process chamber during operation 510 may be about 3 Torr to about 100 Torr, such as about 10 Torr to about 50 Torr, such as about 25 Torr to about 35 Torr, alternatively about 3 Torr to about 10 Torr, alternatively about 10 Torr to about 25 Torr, alternatively about 35 Torr to about 50 Torr, alternatively about 50 Torr to about 100 Torr. In one or more embodiments, the temperature within the processing chamber during operation 510 may be about 75° C. to about 500° C., such as about 150° C. to about 400° C., such as about 250° C. to about 350° C., alternatively about 75° C. to about 150° C., alternatively about 150° C. to about 250° C., alternatively about 350° C. to about 400° C., alternatively about 400° C. to about 500° C. In one or more embodiments, the substrate may be exposed to the recovery precursor for about 1 min to about 10 min, such as about 2.5 min to about 7.5 min, such as about 4 min to about 6 min, alternatively about 1 min to about 2.5 min, alternatively about 2.5 min to about 4 min, alternatively about 6 min to about 7.5 min, alternatively about 7.5 min to about 10 min.

Once the low-k film 302b is repaired via exposure to the recovery precursor, the method 500 further includes operation 240, where the interconnect structure 300C is subjected to a liner deposition process where a liner layer 316 is disposed over the surface of the interconnect structure 300C including, at least, the low-k film 302c and/or the surface of the copper layer 310 to form the interconnect structure 300D. In at least one embodiment, the liner layer 316 of the interconnect structure 300D is a metal liner deposited by an ALD process.

Figure 6:
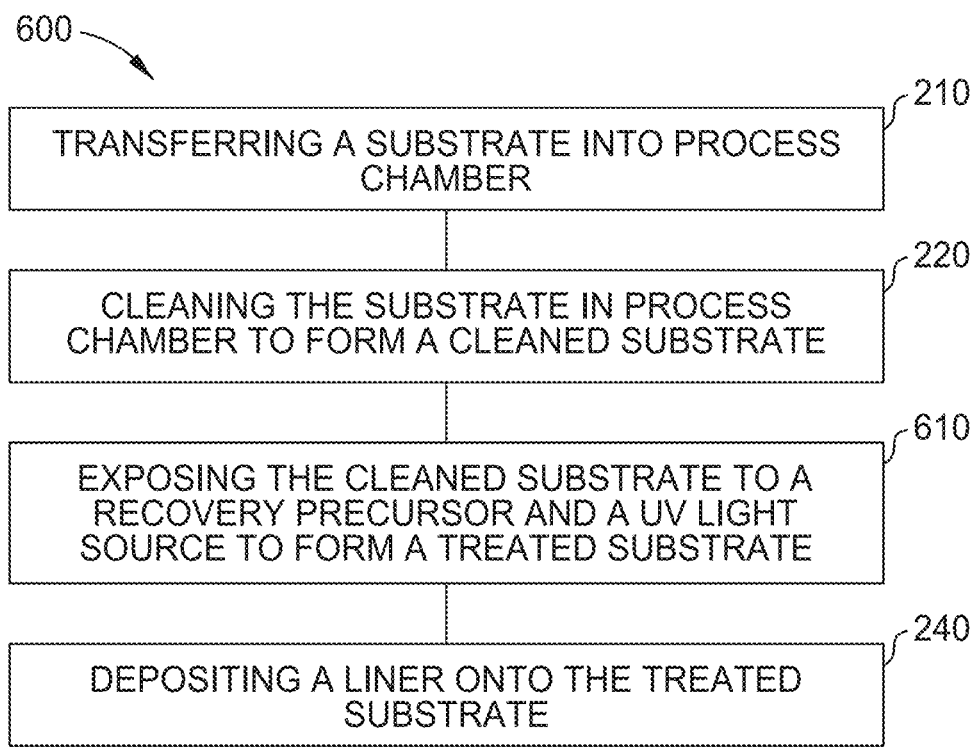
FIG. 6 is a schematic block diagram of a method of substrate processing, according to one or more embodiments.

FIG. 6 is a schematic block diagram of a method 600 of substrate processing, according to one or more embodiments. Similar to the method 200, at operation 210, a substrate, such as an interconnect structure 300A shown in FIG. 3A, is transferred into a process chamber. The process chamber may be a deposition process chamber such as the process chamber 100 depicted in FIG. 1. At operation 210, the interconnect structure 300A is a post-deposition interconnect structure. In other words, the interconnect structure 300A includes a low-k film deposited thereon prior to operation 210. At operation 220, the interconnect structure 300A is cleaned in the process chamber 100. As previously discussed, the cleaning operations of operation 220 can damage the low-k film 302a of the interconnect structure 300A, resulting in the increased hydrophilicity and increased k value of the low-k film 302b of interconnect structure of 300B. At operation 610, the interconnect structure 300B is subjected to a post-treatment process, where the low-k film 302b of the interconnect structure 300B is repaired via simultaneous exposure to a recovery precursor and a UV light source (e.g., UV-assisted silylation reaction).

In some embodiments, operation 610 may be performed in a processing chamber, such as the process chamber 100 depicted in FIG. 1. In some embodiments, the recovery precursor may be introduced to the processing chamber using a precursor gas flow rate of about 100 mgm to about 2000 mgm, such as about 250 mgm to about 1500 mgm, such as about 500 mgm to about 1000 mgm, alternatively about 100 mgm to about 250 mgm, alternatively about 250 mgm to about 500 mgm, alternatively about 1000 mgm to about 1500 mgm, alternatively about 1500 mgm to about 2000 mgm. In some embodiments, the recovery precursor may be introduced into the processing chamber with a carrier gas, such as He, Ar, $N_2$, and combinations thereof. The carrier gas may be introduced into the processing chamber using a gas flow rate of about 1000 sccm to about 5000 sccm, such as about 2000 sccm to about 4000 sccm, such as about 2500 sccm to about 3500 sccm, alternatively about 1000 sccm to about 2000 sccm, alternatively about 2000 sccm to about 2500 sccm, alternatively about 3500 sccm to about 4000 sccm, alternatively about 4000 to about 5000 sccm.

In one or more embodiments, the pressure within the process chamber during operation 610 may be about 3 Torr to about 100 Torr, such as about 10 Torr to about 50 Torr, such as about 25 Torr to about 35 Torr, alternatively about 3 Torr to about 10 Torr, alternatively about 10 Torr to about 25 Torr, alternatively about 35 Torr to about 50 Torr, alternatively about 50 Torr to about 100 Torr. In one or more embodiments, the temperature within the processing chamber during operation 510 may be about 75° C. to about 500° C., such as about 150° C. to about 400° C., such as about 250° C. to about 350° C., alternatively about 75° C. to about 150° C., alternatively about 150° C. to about 250° C., alternatively about 350° C. to about 400° C., alternatively about 400° C. to about 500° C. In one or more embodiments, the substrate may be exposed to the recovery precursor for about 1 min to about 10 min, such as about 2.5 min to about 7.5 min, such as about 4 min to about 6 min, alternatively about 1 min to about 2.5 min, alternatively about 2.5 min to about 4 min, alternatively about 6 min to about 7.5 min, alternatively about 7.5 min to about 10 min.

In one or more embodiments, the interconnect structure 300B may be simultaneously exposed to the UV light source throughout a portion of the time in which the substrate is exposed to the recovery precursor in operation 610. In at least one embodiment, the interconnect structure 300B may be simultaneously exposed to the UV light source throughout the time in which the substrate is exposed to the recovery precursor. In one or more embodiments, the interconnect structure 300B may be exposed to a UV light source of about 600 W/in during operation 610, such as about 400 W/in to about 800 W/in, such as about 500 W/in to about 700 W/in, alternatively about 400 W/in to about 500 W/in, alternatively about 500 W/in to about 600 W/in, alternatively about 600 W/in to about 700 W/in, alternatively about 700 W/in to about 800 W/in.

Once the low-k film 302b of interconnect structure 300B is repaired via simultaneous exposure to the recovery precursor and UV light source to form the low-k film 302c of interconnect structure 300C, the method 600 further includes operation 240, where the interconnect structure 300C is subjected to a liner deposition process where a liner layer 316 is disposed over the surface of the interconnect structure 300C including, at least, the low-k film 302c and/or the surface of the copper layer 310 to form the interconnect structure 300D. In at least one embodiment, the liner layer 316 of interconnect structure 300D is a metal liner deposited by an ALD process.

Figure 7:
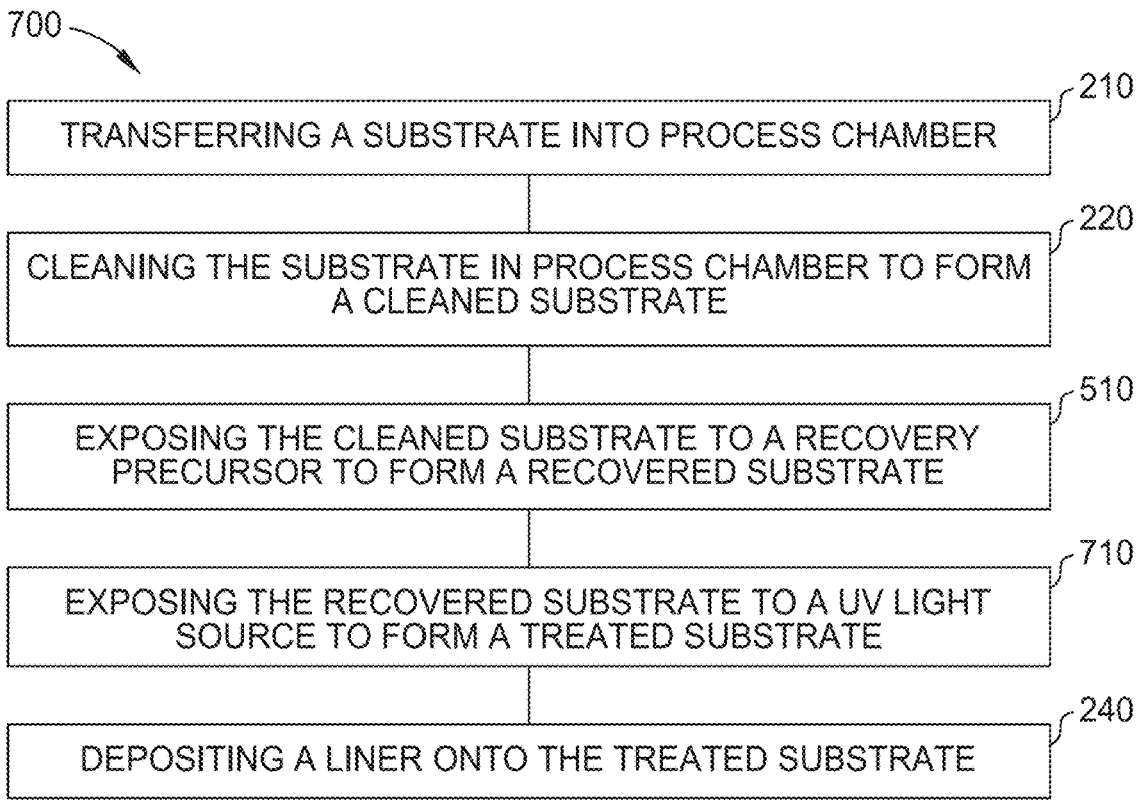
FIG. 7 is a schematic block diagram of a method of substrate processing, according to one or more embodiments.

FIG. 7 is a schematic block diagram of a method 700 of substrate processing, according to one or more embodiments. Similar to the method 200 of FIG. 2, at operation 210 of FIG. 7, a substrate, such as an interconnect structure 300A shown in FIG. 3A, is transferred into a process chamber. The process chamber may be a deposition process chamber such as the process chamber 100 depicted in FIG. 1. At operation 210, the interconnect structure 300A is a post-deposition interconnect structure. In other words, the interconnect structure 300A includes a low-k film deposited thereon prior to operation 210. At operation 220, the interconnect structure 300A is cleaned in the process chamber 100. As previously discussed, the cleaning operations of operation 220 can damage the low-k film 302a of the interconnect structure 300A, resulting in the increased hydrophilicity and increased k values of the low-k film 302b of the interconnect structure 300B. At operation 510, the low-k film 302b of the interconnect structure 300B is repaired via exposure to a recovery precursor.

At operation 710, interconnect structure 300B is subsequently subjected to additional UV treatment with via exposure to a UV light source. In some embodiments, operation 710 may be performed in a processing chamber, such as the process chamber 100 depicted in FIG. 1. In one or more embodiments, the interconnect structure 300B may be exposed to a UV light source of about of about 600 W/in during operation 710, such as about 400 W/in to about 800 W/in, such as about 500 W/in to about 700 W/in, alternatively about 400 W/in to about 500 W/in, alternatively 500 W/in to about 600 W/in, alternatively about 600 W/in to about 700 W/in, alternatively about 700 W/in to about 800 W/in. In one or more embodiments, the interconnect structure 300B may be exposed to the UV light source for about 1 second(s) to about 60 minutes (min) during operation 710, such as about 1 s to about 30 min, such as about 1 s to about 10 min.

In one or more embodiments, the pressure within the process chamber during operation 710 may be about 3 Torr to about 100 Torr, such as about 10 Torr to about 50 Torr, such as about 25 Torr to about 35 Torr, alternatively about 3 Torr to about 10 Torr, alternatively about 10 Torr to about 25 Torr, alternatively about 35 Torr to about 50 Torr, alternatively about 50 Torr to about 100 Torr. In one or more embodiments, the temperature within the processing chamber during operation 510 may be about 75° C. to about 500° C., such as about 150° C. to about 400° C., such as about 250° C. to about 350° C., alternatively about 75° C. to about 150° C., alternatively about 150° C. to about 250° C., alternatively about 350° C. to about 400° C., alternatively about 400° C. to about 500° C. In one or more embodiments, the substrate may be exposed to the recovery precursor for about 1 min to about 10 min, such as about 2.5 min to about 7.5 min, such as about 4 min to about 6 min, alternatively about 1 min to about 2.5 min, alternatively about 2.5 min to about 4 min, alternatively about 6 min to about 7.5 min, alternatively about 7.5 min to about 10 min.

At operation 240, the interconnect structure 300C is subjected to a liner deposition process where a liner layer 316 is disposed over the surface of the interconnect structure 300C including, at least, the low-k film 302c and/or the surface of the copper layer 310 to form the interconnect structure 300D. In at least one embodiment, the liner layer 316 of the interconnect structure 300D is a metal liner deposited by an ALD process.

Figure 8:
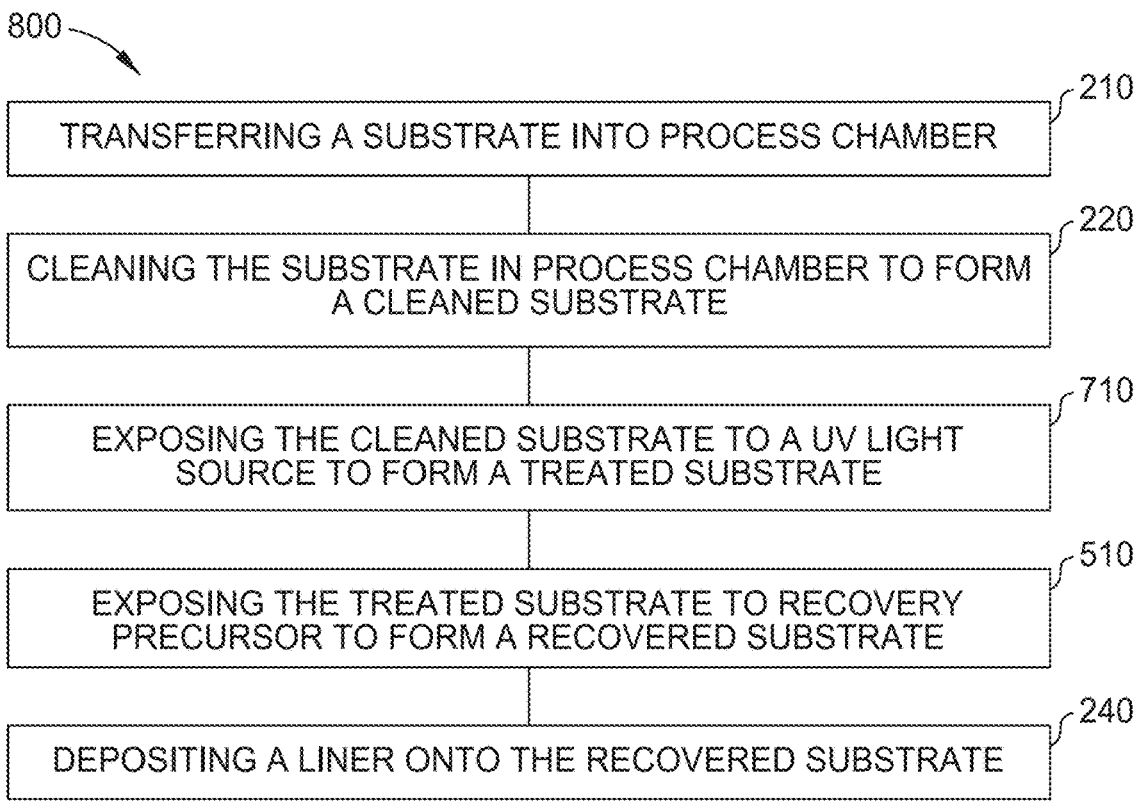
FIG. 8 is a schematic block diagram of a method of substrate processing, according to one or more embodiments.

FIG. 8 is a schematic block diagram of a method 800 of substrate processing, according to one or more embodiments. Similar to the method 200 of FIG. 2, at operation 210 of FIG. 8, a substrate, such as an interconnect structure 300A shown in FIG. 3A, is transferred into a process chamber. The process chamber may be a deposition process chamber such as the process chamber 100 depicted in FIG. 1. At operation 210, the interconnect structure 300A is a post-deposition interconnect structure. In other words, the interconnect structure 300A includes a low-k film deposited thereon prior to operation 210. At operation 220, the interconnect structure 300A is cleaned in the process chamber 100. As previously discussed, the cleaning operations of operation 220 can result damage the low-k film 302a of the interconnect structure 300A, resulting in the increased hydrophilicity and increased k values of the low-k film 302b of the interconnect structure 300B. At operation 710, the low-k film 302b is subjected to UV treatment via exposure to a UV light source. At operation 510, the low-k film 302b of the interconnect structure 300B is repaired via exposure to a recovery precursor to form the low-k film 302c of interconnect structure 300C. At operation 240, the interconnect structure 300C is subjected to a liner deposition process where a liner layer 316 is disposed over the surface of the interconnect structure 300C including, at least, the low-k film 302c and/or the surface of the copper layer 310 to form the interconnect structure 300D. In at least one embodiment, the liner layer 316 of the interconnect structure 300D is a metal liner deposited by an ALD process over the low-k film 302d.

In some embodiments, at least one of the low-k films 302a-302d of one of the interconnect structures 300A-300D prepared via any of the processes disclosed herein can have a k value of about 2.65 to about 3.0, such as about 2.67 to about 2.8, such as about 2.68 to about 2.76, alternatively about 2.65 to about 2.67, alternatively about 2.67 to about 2.68, alternatively about 2.76 to about 2.8, alternatively about 2.8 to about 3.0. In some embodiments, at least one of the low-k films 302a-302d of one of the interconnect structures 300A-300D prepared via any of the processes disclosed herein can have a thickness of about 1200 Å to about 1300 Å, such as about 1225 Å to about 1275 Å, such as about 1240 Å to about 1260 Å, alternatively about 1200 Å to about 1225 Å, alternatively about 1225 Å to about 1240 Å, alternatively about 1260 Å to about 1275 Å, alternatively about 1275 Å to about 1300 Å. In some embodiments, at least one of the low-k films 302a-302c of one of the interconnect structures 300a-300C prepared via any of the processes disclosed herein can have a water contact angle of about 65° to about 85°, such as about 70° to about 80°, such as about 75° to about 80°, such as about 77.5° to about 79.5°, alternatively about 65° to about 70°, alternatively about 70° to about 75°, alternatively about 75° to about 77.5°, alternatively about 79.5° to about 80°, alternatively about 80° to about 85°.

Substrate preparation processes and conditions disclosed herein allow for the recovery of low-k values and hydrophobic properties, where such values may have arisen due to various processing procedures and/or variables. Furthermore, such processes provide capability for further liner layer deposition, such as ALD metal film deposition. Interestingly, it has been determined that the order in which such recovery processes are conducted relates to the degree of recovery of such properties and the enablement of ALD metal film deposition.

Additionally, it has been found that the recovery of hydrophobic properties should be intricately balanced with the recovery of low-k values. While full recovery of the low-k values may be desirable, such recovery should be balanced such that the surface hydrophobicity of the repaired substrate is adequate to allow capability for ALD metal film deposition. The processes disclosed herein integrate sequential recovery operations that allow for operational control and provide balanced recovery of low-k values and hydrophilic/hydrophobic properties favorable for subsequent ALD metal film deposition.

EXAMPLES

Example 1

Samples were prepared in accordance to methods described herein, where a sample includes a low-k film on an etch stop layer, a metal barrier between the etch stop layer and a copper layer, a metal barrier between the copper layer and a substrate. Each of the initial samples exhibited a k value of about 2.61 and a water contact angle of about 105.3° prior to processing. Samples were then subjected to a processing operation including etching, ash, wet cleaning operations, or combinations thereof. The samples were then subjected to various recovery processes, such as (1) no recovery, (2) exposure to a recovery precursor, (3) exposure to a UV light source, (4) simultaneous exposure to a recovery precursor and a UV light source, (5) exposure to a recovery precursor subsequently followed by exposure to a UV light source, and (6) exposure to a UV light source subsequently followed by exposure to a recovery precursor. The samples discussed herein are numerically labelled in accordance to the previously recited recovery process in which the sample undergoes. The resulting k values were measured in accordance with ASTM F1392. The thickness of the samples were measured both before and after treatment via ASTM F576. The resulting water contact angles were also measured in accordance with ASTM D5946. The results are summarized in Table 1. Each of the samples respective k and water contact angles were compared to the corresponding values before prior to processing to determine property recovery as a function of the implemented recovery process.

TABLE 1

Summary of water contact angle and k recovery values as a function of recovery process

| Treatment | k | Δk | Water Contact Angle | Δ Water Contact Angle |
|---|---|---|---|---|
| Pre-processing | 2.61 | — | 105.3° | — |
| 1 | 2.86 | 0.25 | 68.5° | 36.8° |
| 2 | 2.75 | 0.14 | 76.7° | 28.6° |
| 3 | 2.83 | 0.22 | 78.0° | 27.3° |

TABLE 1-continued

Summary of water contact angle and k recovery values as a function of recovery process

| Treatment | k | Δk | Water Contact Angle | Δ Water Contact Angle |
|---|---|---|---|---|
| 4 | 2.76 | 0.15 | 84.2° | 21.1° |
| 5 | 2.76 | 0.15 | 78.3° | 27.0° |
| 6 | 2.68 | 0.07 | 79.9° | 25.4° |

*Δ values are taken as the absolute difference between the pre-processing value and the recovered value.

TABLE 2

Summary of low-k film thickness as a function of recovery process

| Treatment | Thickness Pre-recovery (Å) | Thickness Post-recovery (Å) | Δ Thickness (Å) |
|---|---|---|---|
| 1 | 1261 | — | — |
| 2 | 1292 | 1284 | 8 |
| 3 | 1290 | 1235 | 55 |
| 4 | 1275 | 1239 | 36 |
| 5 | 1262 | 1217 | 45 |
| 6 | 1294 | 1238 | 56 |

*Δ values are taken as the absolute difference between the pre-recovery value and the recovered value.

As can be determined from analysis of Table 1, recovery treatments where the sample is subjected to some form of exposure to a recovery precursor (e.g., treatments 2 and 4-6) result in increased k value recovery. Furthermore, recovery treatments including exposure to both a recovery precursor and a UV light source (e.g., treatments 4-6) exhibit increases in both water contact angle and k value recovery. Without being bound by theory, such recovery phenomena may be understood by the molecular structures of FIGS. 4A-4C. For instance, the pre-processing sample can be illustrated by FIG. 4A where the low-k film includes Si—O bonds, Si—$CH_3$ bonds, and Si—H bonds. Sample 1 (e.g., a processed sample not undergoing a recovery process) can be illustrated by FIG. 4B where the low-k film includes a decreased number of Si—$CH_3$ bonds the formation of Si—OH bonds. The formation of the Si—OH bonds can increase the hydrophilicity and k value of the low k film, as indicated by the increased Δk and Δwater contact angle value relative to Samples 2-6. Samples 2-6 (e.g., processed samples undergoing a recovery process) can be illustrated by FIG. 4C where the low-k film has a decreased number of Si—OH bonds and an increased number of Si—$CH_3$ bonds relative to Sample 1. As such, the difference in recovery values of Samples 2-6 can be attributed to the relative number of Si—OH and Si—$CH_3$ bonds as compared to the pre-processed sample.

Additionally, it can be determined from Table 2 that recovery treatments including exposure to UV light source result in decreased film thickness. Without being bound by theory, exposing the low-k films to UV light can cause film shrinkage as a result of the intensity of the light source and/or the length of exposure thereto.

Example 2

Figure 9:
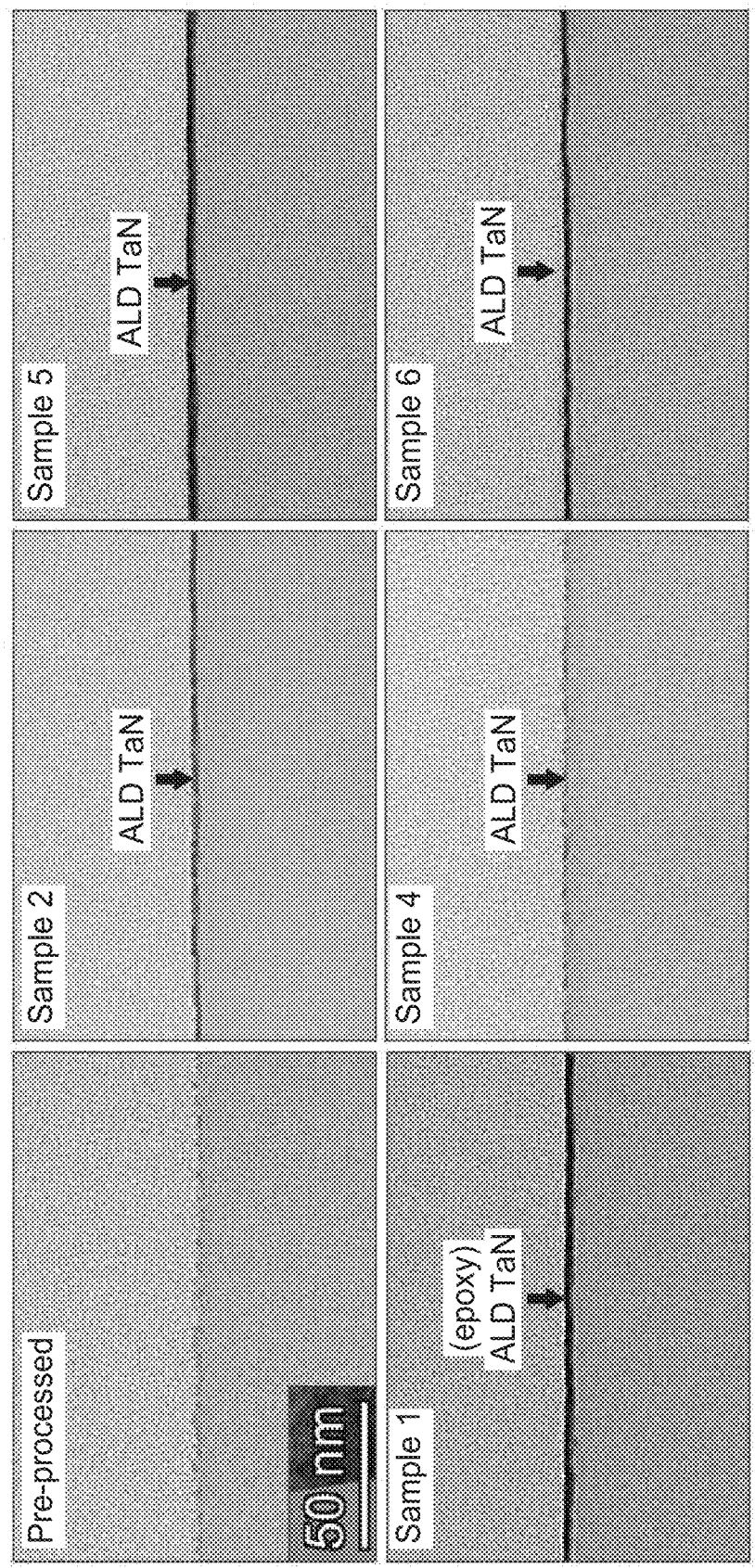
FIG. 9 is a series of surface images of an interconnect structure after a method, according to one or more embodiments.

FIG. 9 is images showing samples having undergone ALD of tantalum nitride (TaN) subsequent processing and various recovery processes. As can be observed, Samples 1-2 and Samples 5-6 exhibit moderate to good continuity over the surface of each sample, respectively. Without being bound by theory, this finding suggests that the surface hydrophobic/hydrophilic properties of these samples are suitable for ALD of a metal film. In contrast, the pre-processed sample and Sample 4 do not exhibit the same uniformity as Samples 1-2 and Samples 5-6. As previously discussed, hydrophilic/hydrophobic properties of the surface of a sample should be adequate to promote favorable and subsequent ALD metal film deposition. Additionally, surface homogeneity is desired in hydrophilic/hydrophobic properties to enable smooth ALD nucleation.

While the recovery process of Sample 4 promotes substantial recovery of low-k values, it also promotes a large degree of surface hydrophobicity recovery, so much so that subsequent ALD metal film deposition is hindered. As previously discussed, the recovery of hydrophobic properties can be balanced with the recovery of low-k values so to allow for subsequent ALD metal film deposition. Interestingly, Samples 5-6 exhibit good continuity over the surface of each sample upon undergoing ALD of TaN, suggesting that the surface hydrophobic/hydrophilic properties of these samples are suitable for ALD of a metal film. Furthermore, Samples 5-6 exhibit substantial recovery of surface hydrophobic properties and k value, as evidenced in Table 1. Thus, it has been found that the sequential recovery processes of Sample 5-6 (e.g., (5) exposure to a recovery precursor subsequently followed by exposure to a UV light source and (6) exposure to a UV light source subsequently followed by exposure to a recovery precursor) adequately balance recovery of low-k values and hydrophilic/hydrophobic properties such that the surface of the resulting films are favorable for subsequent ALD metal film deposition.

Overall, the present disclosure provides methods by which to recover properties of damaged low-k films. Processes disclosed herein generally include a processing operation that can damage the molecular structure of the low-k film causing an increase in k value and hydrophilicity. As discussed herein, the sequential recovery processes implemented herein (e.g., exposure to a recovery precursor subsequently followed by exposure to a UV light source or exposure to a UV light source subsequently followed by exposure to a recovery precursor) enable high degrees of property recovery. Additionally, the sequential recovery processes disclosed herein provide a balance between the recovery of low-k values and recovery of hydrophilic/hydrophobic properties such that the surface of the resulting films are favorable for subsequent ALD metal film deposition.

For the purposes of this present disclosure, and unless otherwise specified, the term "alkyl" or "alkyl group" interchangeably refers to a hydrocarbyl group consisting of carbon and hydrogen atoms. An alkyl group can be substituted or unsubstituted and can be linear, branched, or cyclic.

For the purposes of this present disclosure, and unless otherwise specified, the term "cycloalkyl" or "cycloalkyl group" interchangeably refers to a hydrocarbyl group wherein the carbon atoms form one or more ring structures.

For the purposes of this present disclosure, and unless otherwise specified, the term "alkenyl" or "alkenyl group" interchangeably refers to a linear unsaturated hydrocarbyl group comprising a C=C bond therein.

For the purposes of this present disclosure, and unless otherwise specified, the term "aryl" or "aryl group" interchangeably refers to a hydrocarbyl group comprising an aromatic ring structure therein.

While the foregoing is directed to embodiments of the present disclosure, other and further embodiments of the disclosure may be devised without departing from the basic scope thereof, and the scope thereof is determined by the claims that follow.

The invention claimed is:

1. A method, comprising:
positioning a substrate within a processing chamber, the substrate comprising a first low-k film having a first water contact angle, the first low-k film disposed over an interconnect structure;
cleaning the substrate within the processing chamber to form a cleaned substrate, the cleaned substrate comprising a damaged low-k film having a second water contact angle and the damaged low-k film is a product of the first low-k film;
exposing the cleaned substrate to a recovery precursor to form a recovered substrate, the recovered substrate comprising a recovered low-k film and the recovered low-k film is a product of the damaged low-k film;
exposing the recovered substrate to a UV light source to form a treated substrate, the treated substrate comprising a treated low-k film having a third water contact angle and the treated low-k film is a product of the recovered low-k film, wherein each of the first low-k film and the treated low-k film independently comprise a k value and the k value of the first low-k film is less than the k value of the treated low-k film; and
depositing a liner layer over the treated substrate via atomic layer deposition (ALD).

2. The method of claim 1, wherein each of the first low-k film and the damaged low-k film independently comprise a k value and the k value of the first low-k film is less than the k value of the damaged low-k film.

3. The method of claim 1, wherein each of the damaged low-k film and the treated low-k film independently comprise a k value and the k value of the damaged low-k film is greater than the k value of the treated low-k film.

4. The method of claim 1, wherein the first water contact angle is greater than the second water contact angle.

5. The method of claim 1, wherein the second water contact angle is less than the third water contact angle.

6. The method of claim 1, wherein the first water contact angle is greater than the second water contact angle, wherein the second water contact angle is less than the third water contact angle.

7. The method of claim 1, wherein each of the first low-k film, the damaged low-k film, and the treated low-k film independently comprise a k value, wherein:
the k value of the first low-k film is less than the k value of the damaged low-k film; and
the k value of the damaged low-k film is greater than the k value of the treated low-k film.

8. The method of claim 1, wherein exposing the cleaned substrate to a recovery precursor to form a recovered substrate comprises:
introducing the recovery precursor to the processing chamber using a precursor gas flow rate of about 100 milligrams per minute (mgm) to about 2000 mgm;
introducing a carrier gas into the processing chamber using a gas flow rate of about 1000 standard cubic centimeters per minute (sccm) to about 5000 sccm; and
maintaining a pressure of about 3 Torr to about 100 Torr and a temperature of about 75° C. to about 500° C. within the processing chamber.

9. The method of claim 1, wherein the UV light source comprises an intensity of about 400 W/in to about 800 W/in.

10. The method of claim 1, wherein the liner layer comprises a thickness of about 1200 Å to about 1300 Å.

11. A method, comprising:
positioning a substrate within a processing chamber, the substrate comprising a first low-k film having a first water contact angle, the first low-k film disposed over an interconnect structure;
cleaning the substrate within the processing chamber to form a cleaned substrate, the cleaned substrate comprising a damaged low-k film having a second water contact angle and the damaged low-k film is a product of the first low-k film;
exposing the cleaned substrate to a UV light source to form a treated substrate, the treated substrate comprising a treated low-k film having a third water contact angle and the treated low-k film is a product of the damaged low-k film;
exposing the treated substrate to a recovery precursor to form a recovered substrate, the recovered substrate comprising a recovered low-k film and the recovered low-k film is a product of the treated low-k film, wherein each of the first low-k film and the recovered low-k film independently comprise a k value, the k value of the first low-k film being less than the k value of the recovered low-k film; and
depositing a liner layer over the recovered substrate via atomic layer deposition (ALD).

12. The method of claim 11, wherein each of the first low-k film and the damaged low-k film independently comprise a k value, the k value of the first low-k film being less than the k value of the damaged film.

13. The method of claim 11, wherein each of the damaged low-k film and the recovered low-k film independently comprise a k value, the k value of the damaged low-k film being greater than the k value of the recovered low-k film.

14. The method of claim 11, wherein the first water contact angle is greater than the second water contact angle.

15. The method of claim 11, wherein the second water contact angle is less than the third water contact angle.

16. The method of claim 11, wherein the first water contact angle is greater than the second water contact angle, and the second water contact angle is less than the third water contact angle.

17. The method of claim 11, wherein each of the first low-k film, the damaged low-k film, and the recovered low-k film independently comprise a k value, wherein:
the k value of the first low-k film is less than the k value of the damaged low-k film; and
the k value of the damaged low-k film is greater than the k value of the recovered low-k film.

18. The method of claim 11, wherein the UV light source comprises an intensity of about 400 W/in to about 800 W/in.

19. The method of claim 11, wherein the liner layer comprises a thickness of about 1200 Å to about 1300 Å.

20. A method, comprising:
positioning a substrate within a processing chamber, the substrate comprising a first low-k film having a first water contact angle, the first low-k film disposed over an interconnect structure;
cleaning the substrate within the processing chamber to form a cleaned substrate, the cleaned substrate comprising a damaged low-k film having a second water contact angle and the damaged low-k film is a product of the first low-k film;
exposing the cleaned substrate to a recovery precursor to form a recovered substrate, the recovered substrate comprising a recovered low-k film and the recovered low-k film is a product of the damaged low-k film;
exposing the recovered substrate to a UV light source to form a treated substrate, the treated substrate comprising a treated low-k film having a third water contact angle and the treated low-k film is a product of the recovered low-k film, wherein each of the first low-k film and the treated low-k film independently comprise a k value and the k value of the first low-k film is less than the k value of the treated low-k film; and
depositing a liner layer over the treated substrate via atomic layer deposition (ALD),
wherein the first water contact angle is greater than the second water contact angle, and the second water contact angle is less than the third water contact angle.

21. The method of claim 20, wherein the liner layer comprises a thickness of about 1200 Å to about 1300 Å.

* * * * *